(12) United States Patent
Mische

(10) Patent No.: US 10,785,864 B2
(45) Date of Patent: Sep. 22, 2020

(54) PRINTED CIRCUIT BOARD WITH HEAT SINK

(71) Applicant: Amazon Technologies, Inc., Seattle, WA (US)

(72) Inventor: William Mische, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/711,707

(22) Filed: Sep. 21, 2017

(65) Prior Publication Data

US 2019/0090343 A1 Mar. 21, 2019

(51) Int. Cl.
*H05K 1/02* (2006.01)
*H05K 3/46* (2006.01)
(Continued)

(52) U.S. Cl.
CPC ............. *H05K 1/021* (2013.01); *B33Y 80/00* (2014.12); *H05K 1/0204* (2013.01); *H05K 1/181* (2013.01); *H05K 3/0044* (2013.01); *H05K 3/4697* (2013.01); *F28F 3/022* (2013.01); *F28F 2275/14* (2013.01); *H05K 3/005* (2013.01);
(Continued)

(58) Field of Classification Search
CPC ................. H05K 1/185; H05K 1/0204; H05K 2201/10416; H05K 3/0061; H05K 1/181; H05K 1/183; H05K 2201/066; H05K 7/2039; H05K 1/0203; H05K 2201/1056; H05K 7/20418; H05K 9/0028; H05K 9/0032; H05K 2201/09; H05K 2201/09745; H05K 2201/09954; H05K 2201/10969; H05K 1/021; H05K 1/0212; H05K 1/036; H05K 1/11; H05K 1/18; H05K 2201/048; G06F 1/183; G06F 1/20
See application file for complete search history.

(56) References Cited

U.S. PATENT DOCUMENTS 4,716,494 A * 12/1987 Bright ................. H01L 23/4093
165/80.3
4,835,598 A 5/1989 Higuchi et al.
(Continued)

FOREIGN PATENT DOCUMENTS

DE 102007039064 2/2009
EP 2222145 8/2010
(Continued)

OTHER PUBLICATIONS

Office Action for U.S. Appl. No. 15/812,756, dated Sep. 11, 2018, William Mische, "Printed Circuit Board With Embedded Lateral Connector", 12 pages.
(Continued)

*Primary Examiner* — Binh B Tran
*Assistant Examiner* — Michael A Matey
(74) *Attorney, Agent, or Firm* — Lee & Hayes P.C.

(57) ABSTRACT

Printed circuit boards (PCBs) may include a heat sink configured to draw heat from a surface-mounted component through the PCB toward a side of the PCB opposite a side having the surface-mounted component. The heat sinks may be single piece components that extend at least partially through the PCB. In some embodiments, the PCB may include connectors that interface between the PCB and a heat sink, or possibly other components.

20 Claims, 11 Drawing Sheets

Section A-A

(51) Int. Cl.
H05K 1/18 (2006.01)
H05K 3/00 (2006.01)
B33Y 80/00 (2015.01)
F28F 3/02 (2006.01)
H05K 3/10 (2006.01)

(52) U.S. Cl.
CPC ..... *H05K 3/10* (2013.01); *H05K 2201/09063* (2013.01); *H05K 2201/09845* (2013.01); *H05K 2201/10053* (2013.01); *H05K 2201/1059* (2013.01); *H05K 2201/10166* (2013.01); *H05K 2201/10295* (2013.01); *H05K 2201/10386* (2013.01); *H05K 2201/10416* (2013.01); *H05K 2201/2072* (2013.01); *H05K 2203/0108* (2013.01); *H05K 2203/0228* (2013.01); *H05K 2203/063* (2013.01); *H05K 2203/166* (2013.01)

(56) References Cited

U.S. PATENT DOCUMENTS

| | | | |
|---|---|---|---|
| 4,860,165 A * | 8/1989 | Cassinelli | H01L 23/36 165/80.4 |
| 5,337,388 A * | 8/1994 | Jacobowitz | G02B 6/3807 385/76 |
| 5,459,639 A | 10/1995 | Izumi | |
| 5,920,458 A * | 7/1999 | Azar | H01L 23/3677 174/252 |
| 6,580,611 B1 * | 6/2003 | Vandentop | H01L 23/367 165/185 |
| 7,233,496 B2 * | 6/2007 | Lee | H01L 23/4093 257/E23.086 |
| 7,458,825 B2 | 12/2008 | Atsmon et al. | |
| 8,317,524 B2 | 11/2012 | Bailey | |
| 8,572,841 B2 | 11/2013 | Pedersen et al. | |
| 9,136,522 B2 | 9/2015 | Lee | |
| 9,198,278 B2 | 11/2015 | Lim et al. | |
| 9,437,943 B1 | 9/2016 | Davis | |
| 2006/0043581 A1 * | 3/2006 | Prokofiev | H01L 23/49838 257/713 |
| 2006/0234521 A1 | 10/2006 | Uchida et al. | |
| 2008/0087456 A1 * | 4/2008 | Schuette | H05K 1/0207 174/252 |
| 2008/0278917 A1 | 11/2008 | Lin et al. | |
| 2010/0294546 A1 | 11/2010 | Nickel et al. | |
| 2011/0183540 A1 | 7/2011 | Keenihan et al. | |
| 2011/0273834 A1 | 11/2011 | Moriai et al. | |
| 2012/0063094 A1 * | 3/2012 | Gaynes | H05K 1/0206 361/707 |
| 2014/0198471 A1 | 7/2014 | Kajio et al. | |
| 2015/0029674 A1 * | 1/2015 | Ko | H05K 1/0204 361/720 |
| 2015/0201533 A1 * | 7/2015 | Daughtry, Jr. | H05K 9/0028 174/377 |
| 2015/0257249 A1 * | 9/2015 | Kim | H05K 1/0204 361/700 |
| 2016/0014927 A1 * | 1/2016 | Chen | H05K 7/2039 361/720 |
| 2016/0079696 A1 | 3/2016 | Krishnamoorthy | |
| 2016/0262259 A1 | 9/2016 | Ueyama et al. | |
| 2017/0099725 A1 * | 4/2017 | Maillet, Jr. | H05K 1/021 |
| 2017/0231113 A1 * | 8/2017 | Anderl | G06F 1/20 |
| 2020/0067219 A1 | 2/2020 | Mische | |

FOREIGN PATENT DOCUMENTS

| | | |
|---|---|---|
| JP | 2003132668 | 5/2003 |
| WO | WO2004103038 | 11/2004 |
| WO | WO2007045520 | 4/2007 |
| WO | WO2014091000 | 6/2014 |

OTHER PUBLICATIONS

The PCT Search Report and Written Opinion dated Jan. 3, 2019 for PCT Application No. PCT/US2018/051429, 16 pages.

The PCT Search Report and Written Opinion dated Mar. 6, 2019 for PCT Application No. PCT/US2018/060794, 37 pages.

* cited by examiner

Section A-A

Section A-A

Section A-A

Section A-A

Section A-A

Section A-A

Section A-A

Section A-A

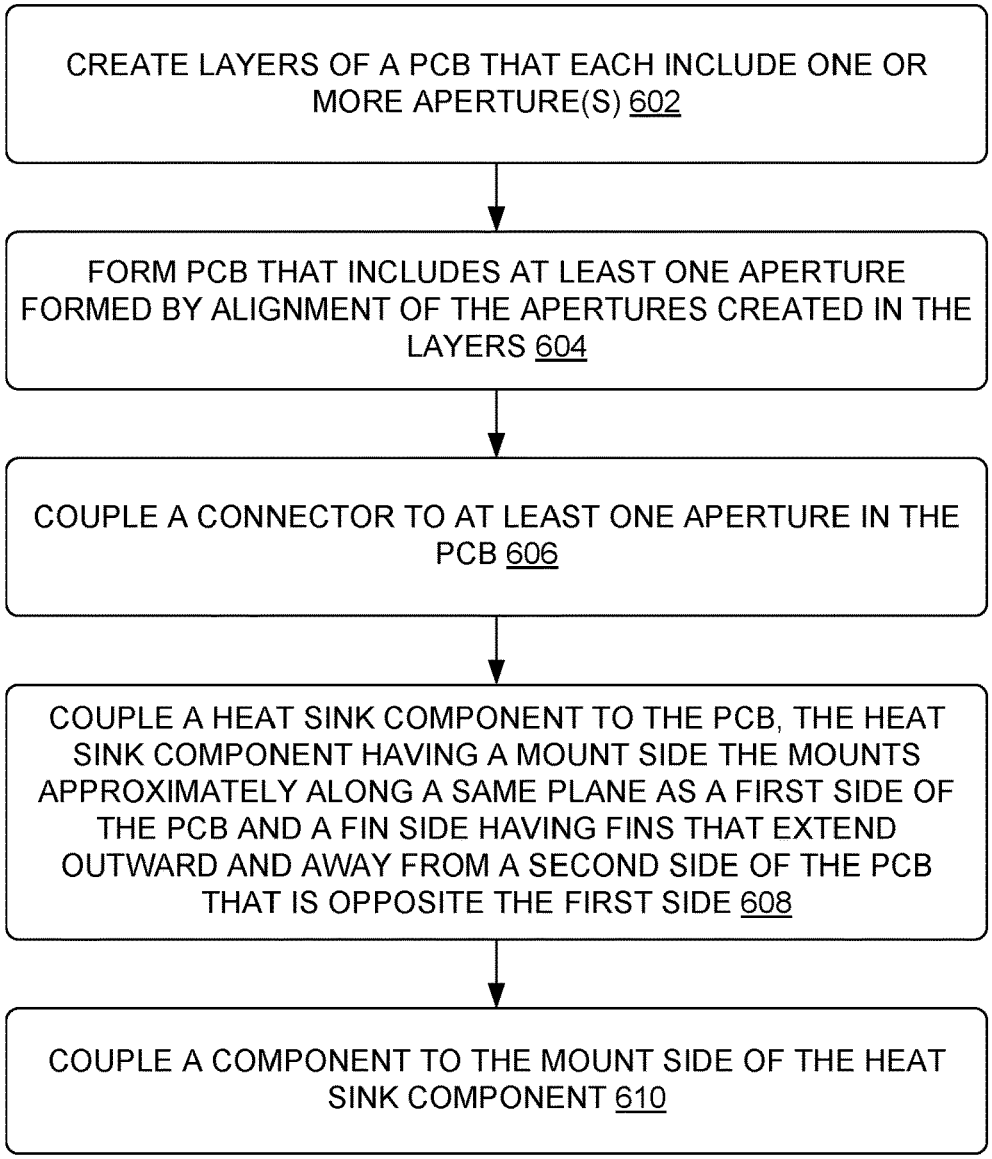

```
┌─────────────────────────────────────────────┐
│  CREATE LAYERS OF A PCB THAT EACH INCLUDE   │
│       ONE OR MORE APERTURE(S) 602           │
└─────────────────────────────────────────────┘
                      ↓
┌─────────────────────────────────────────────┐
│  FORM PCB THAT INCLUDES AT LEAST ONE        │
│  APERTURE FORMED BY ALIGNMENT OF THE        │
│  APERTURES CREATED IN THE LAYERS 604        │
└─────────────────────────────────────────────┘
                      ↓
┌─────────────────────────────────────────────┐
│  COUPLE A CONNECTOR TO AT LEAST ONE         │
│  APERTURE IN THE PCB 606                    │
└─────────────────────────────────────────────┘
                      ↓
┌─────────────────────────────────────────────┐
│  COUPLE A HEAT SINK COMPONENT TO THE PCB,   │
│  THE HEAT SINK COMPONENT HAVING A MOUNT     │
│  SIDE THE MOUNTS APPROXIMATELY ALONG A      │
│  SAME PLANE AS A FIRST SIDE OF THE PCB      │
│  AND A FIN SIDE HAVING FINS THAT EXTEND     │
│  OUTWARD AND AWAY FROM A SECOND SIDE OF     │
│  THE PCB THAT IS OPPOSITE THE FIRST SIDE 608│
└─────────────────────────────────────────────┘
                      ↓
┌─────────────────────────────────────────────┐
│  COUPLE A COMPONENT TO THE MOUNT SIDE OF    │
│  THE HEAT SINK COMPONENT 610                │
└─────────────────────────────────────────────┘
```

FIG. 6

PRINTED CIRCUIT BOARD WITH HEAT SINK

BACKGROUND

Some electrical components generate heat during operation. Heat generated from electrical components, such as microprocessors or integrated circuits having resistors, may be considerably greater than heat generated from other electrical components, such as capacitors. In some instances, this heat may be extracted from a component using an active heat exchanger, such as a fan or fluid cooled system. In other situations, the heat may be extracted from a component using a passive heat exchanger, such as a heat sink.

Printed circuit boards (PCBs) are typically formed during a manufacturing process, and then later modified to add components, such as surface-mounted processors and other components that may generate heat on the PCB. Design requirements may require heat to be drawn from a bottom of a surface-mounted component and through the PCB. For example, some components are designed to have the lowest thermal conductivity between their critical functional zones and the solder connection to the PCB. This means that the heat must be conducted through the PCB.

In various implementations, vertical interconnect access (VIA) devices are located under a surface-mounted component to draw heat from the surface-mounted component through the PCB. However, these devices are only capable of drawing a small portion of heat through the PCB and away from the surface mounted-component.

In some implementations, copper coins are inserted in a gap created by milling a cavity in a PCB after formation of the PCB. The copper coin may interface with the bottom side of the surface-mounted component, by way of the cavity, to draw heat from the surface-mounted component through the PCB. The copper coins are capable of drawing more heat through the PCB and away from the surface-mounted component than use of VIA devices. Using a separate manufacturing process, fins may be attached to the copper coins to enhance heat dissipation from the copper coins. This configuration is expensive and time consuming to implement since it involves multiple processes after manufacture of the PCB. In addition, use of a separate fin attached to a copper coin limits heat transfer between the copper coin and the fin, which results in greater thermal resistance and diminished heat transfer from the surface-mounted component.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIG. 6 is a flow diagram of an illustrative process to manufacture a PCB that includes a connector and/or a heat sink configured to draw heat through a PCB.

DETAILED DESCRIPTION

This disclosure is directed to printed circuit boards (PCBs) that include a heat sink configured to draw heat from a surface-mounted component through the PCB toward a side of the PCB opposite a side having the surface-mounted component, and the disclosure is directed to processes to manufacture the same. The disclosure is also directed to PCBs that include connectors, which may be used to couple components to the PCB, such as heat sinks.

In accordance with one or more embodiments, layers used to form a PCB may be formed with one or more apertures on each layer. The apertures may be formed by die cuts or removing material in other ways (e.g., milling, etc.), formed by printing each layer to exclude material in locations to form the aperture(s), or by other known techniques to form a layer with at least one aperture. A PCB may be formed using the layers. The apertures of the layers may be aligned when forming the PCB such that the PCB includes at least one PCB aperture that extends from a first side of the PCB towards a second side of the PCB. The PCB aperture may extend completely through the PCB. In some embodiments, the PCB aperture may include PCB features, such as a lip, edge, or other feature to interface with a connector and/or a heat sink.

In some embodiments, a connector (also referred to as an "interface" or a "coupler") may be coupled to the PCB aperture, possibly via the aforementioned PCB features. The connector may include connector features that are configured to couple to other components, such as a heat sink.

A heat sink may be coupled to the PCB aperture included in the PCB, possibly using a connector, or possibly directly to the PCB by way the aforementioned PCB features. The heat sink may include a mounting side configured to interface with a surface-mounted component that is mounted on the PCB. The heat sink may include a fin side, opposite the mounting side. The fin side may include one or more fins configured to dissipate heat on a side of the PCB opposite the side having the surface-mounted component. The heat sink may be formed as a single piece such that the first side and the fin side are integrally formed as a single component, and thereby reducing thermal resistance and increasing heat transfer from the surface-mounted component. The illustrative heat sink may also weigh less than conventional heat sinks due to a single piece design.

In some embodiments, the surface-mounted component may be coupled to the PCB at least partially over the mounting side of the heat sink. The surface-mounting component may be in physical contact with the heat sink and/or may interface with the heat sink by way of thermal grease or other substances to reduce thermal resistance between the surface-mounted component and the heat sink.

The apparatuses and techniques described herein may be implemented in a number of ways. Example implementations are provided below with reference to the following figures.

Figure 1:
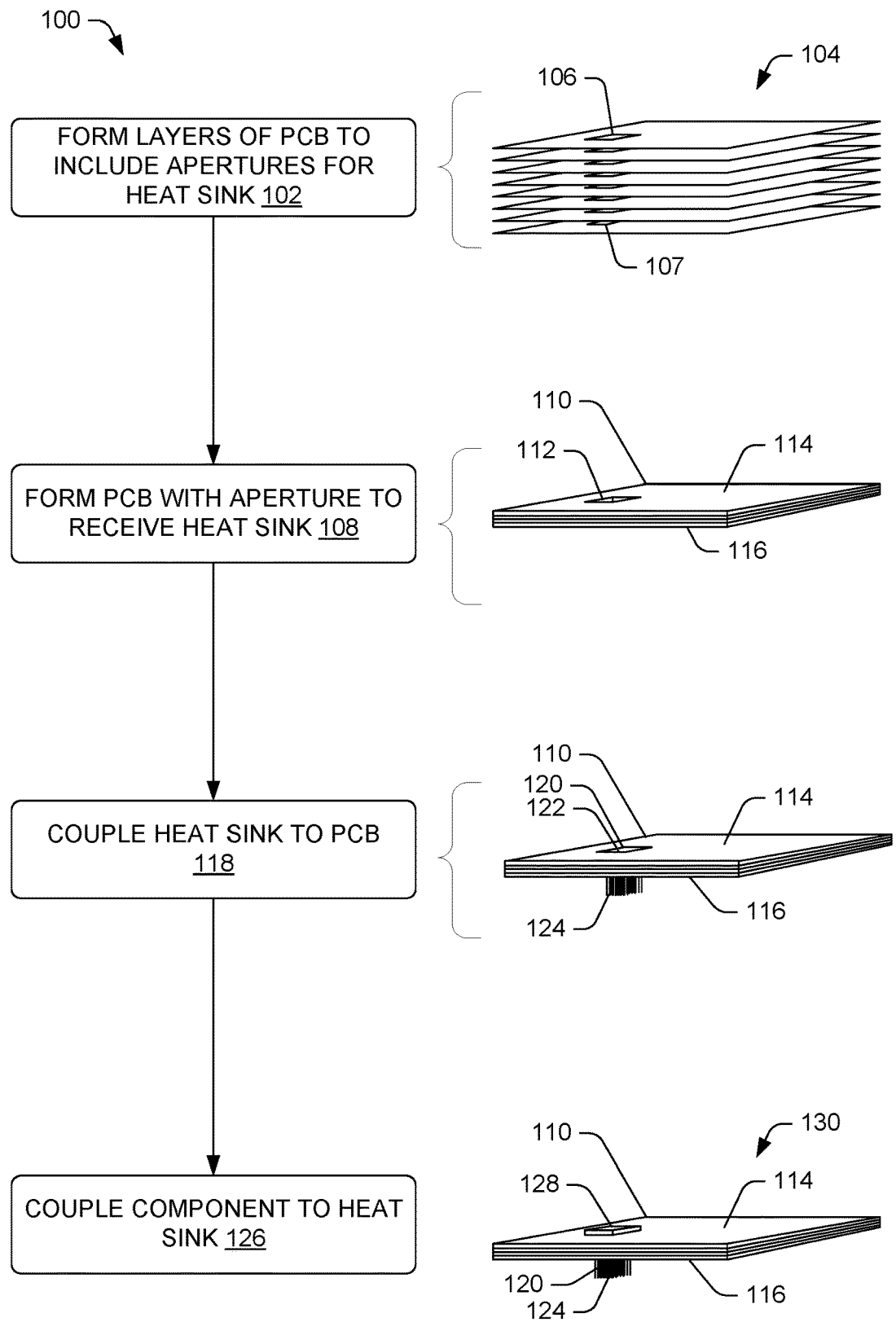
FIG. 1 is a pictorial flow diagram showing an illustrative process to create a printed circuit board (PCB) with a heat sink configured to draw heat from a surface-mounted component through the PCB toward a side opposite the surface-mounted component.

FIG. 1 is a pictorial flow diagram showing an illustrative process 100 to create a printed circuit board (PCB) with a heat sink configured to draw heat from a surface-mounted component through the PCB toward a side opposite the surface-mounted component.

At 102, layers 104 used to form a PCB are formed to include apertures 106 for a heat sink. The layers 104 may be formed of a fiberglass, plastic, or other material commonly used to form PCBs. In some embodiments, the layers 104 may be formed by an additive manufacturing process that utilizes three-dimensional (3D) printing. The additive manufacturing process may omit or refrain from adding material in certain areas to form the apertures. In some embodiments, the layers 104 may be machined, die cut, or otherwise processed to remove material to form the apertures 106. In some embodiments an aperture 107 may be smaller in size relative to at least one of the other apertures 106. This difference in size may form a lip or feature in the PCB that may be used to restrain movement of the heat sink relative to the PCB.

At 108, a PCB 110 may be formed by combining the layers 104. The layers 104 may be aligned such that the apertures 106 create a PCB aperture 112 that enables access from a first side 114 of the PCB 110 toward a second side 116 of the PCB 110. In some embodiments, a first layer may include a first layer aperture that is smaller in size than a second layer aperture of a second layer. The different in the first layer aperture and the second layer aperture may create additional surface area on the first layer, which may be used to constrain a heat sink, as discussed below.

At 118, a heat sink 120 may be coupled to the PCB 110 via the PCB aperture 112, or possibly via a connector as discussed below with reference to FIGS. 5A-5F. The heat sink 120 may include a mounting side 122 and a fin side 124 located opposite the mounting side 122. The mounting side 122 may include a substantially planar surface to physically interface with a component that generates heat. The heat sink may draw heat from the component from the first side of the PCB 114 and draw the heat toward the second side 116 of the PCB toward the fin side 124 of the heat sink 120, thereby cooling the component. In some embodiments, the heat sink 120 may be inserted into the PCB aperture 112 through the first side 114 of the PCB and may be constrained from moving all the way through the PCB aperture 112 by a surface, such as a surface of the first layer which may have a larger surface area than a surface area of the second layer, as discussed above.

At 126, a surface-mounted component 128 (or "component 128") may be coupled to the PCB 110 over the mounting side 122 of the heat sink 120 such that the surface-mounted component 128 physically interfaces with the heat sink 120. In some embodiments, thermal grease, thermal tape, and/or other thermal treatments may be applied between the surface-mounted component 128 and the heat sink 120 to reduce thermal resistance between the surface-mounted component 128 and the heat sink 120. After coupling of the component 128, the assembly may form an operable electronic device 130, which may include multiple surface-mounted components and corresponding multiple heat sinks located in multiple apertures formed in the matter described above.

Figure 2A:
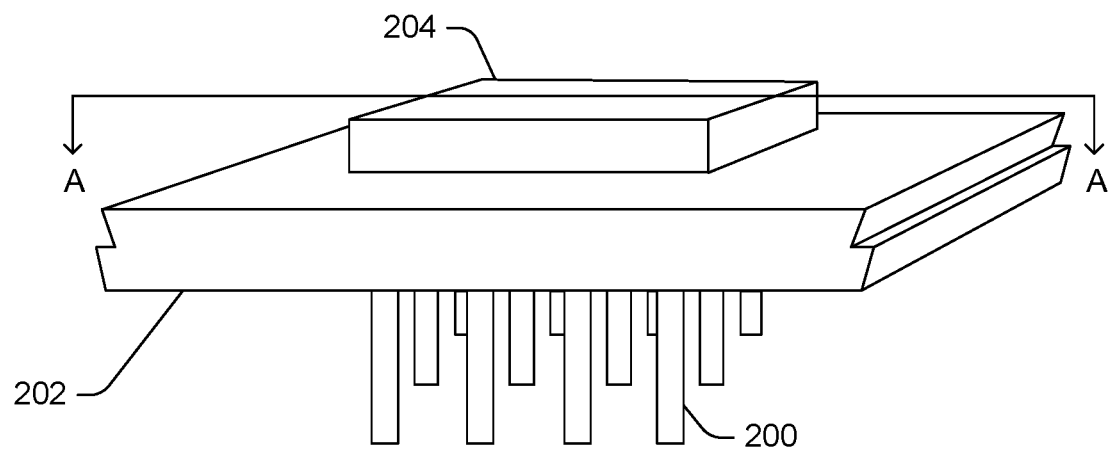
FIG. 2A is a perspective view of an illustrative PCB that include illustrative heat sinks configured to draw heat through the PCBs.

FIG. 2A is a perspective view of an illustrative PCB that includes an illustrative heat sink 200 configured to draw heat through a PCB 202 (shown as a cutout of a larger PCB for illustration purposes). The PCB 202 may include a surface-mounted component 204 that generates heat. The surface-mounted component 204 may be a processor, a microprocessor, a switching semiconductor, a MOSFET, a power transistor, a switching device, and/or any other electrical component that generates heat. The heat sink 200 may be thermally interact with the surface-mounted component 204 to draw heat from the surface-mounted component 204 and direct the heat through the PCB 202 toward an opposite side of the PCB 202.

Figure 2B:
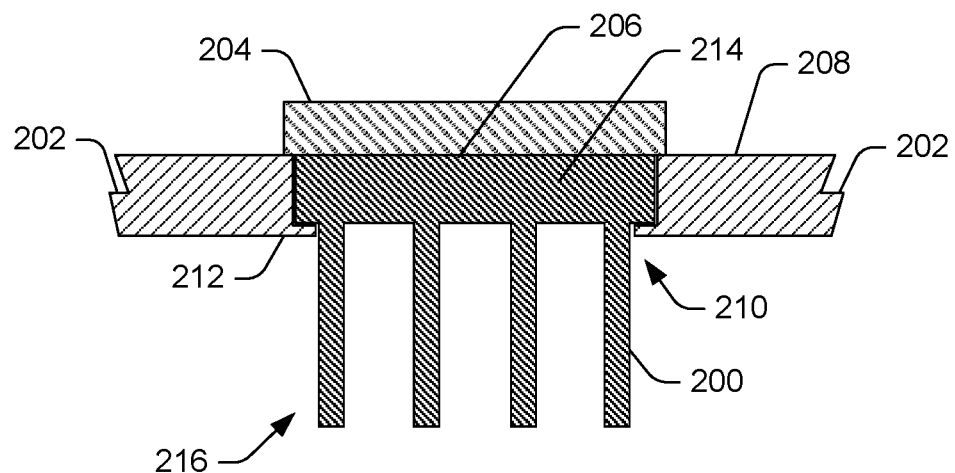
FIGS. 2B-2G are cross-sectional side elevation views of illustrative PCBs that include illustrative heat sinks configured to draw heat through the PCBs.

FIGS. 2B-2G are cross-sectional side elevation views along section line A-A shown in FIG. 2A. FIGS. 2B-2B show illustrative PCBs that include illustrative heat sinks configured to draw heat through the PCBs.

FIG. 2B shows a cross-sectional side elevation view (along section line A-A shown in FIG. 2A) of an illustrative heat sink 200 coupled directly to a PCB 202 (shown as a cutout of a larger PCB for illustration purposes). A surface-mounted component 204 is coupled to a mounting side 206 of the heat sink 200. The heat sink 200 may be press fit or otherwise secured in the PCB 202 such that the mounting side 206 is approximately coplanar with a first side 208 of the PCB 202. For example, the heat sink 200 (and other heat sinks discussed herein) may be secured at least in part by solder used at least partly to form connections between the surface-mounted component 204 and the PCB 202. For example, the solder may also couple the heat sink 200 to the PCB 202. In some embodiments, the heat sink 200 may be inserted into an aperture 210 by way of the first side 208 of the PCB 202.

The PCB 202 may include a restraining feature 212, such as a lip, shelf, or other type of feature that constrains movement of the heat sink 200 in at least one direction. As shown, the restraining feature 212 enables insertion of the heat sink into the aperture 210, but prevents the heat sink from moving past the restraining feature 212. Contact by the heat sink 200 with the restraining feature 212 may coincide with alignment of the mounting side 206 and first side 208 of the PCB.

As shown, the heat sink 200 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

Figure 2C:
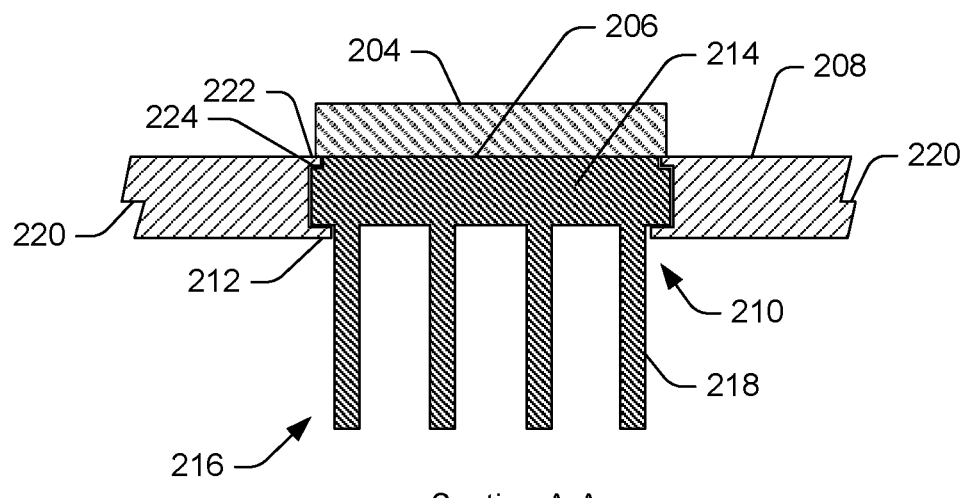

FIG. 2C shows a cross-sectional side elevation view (along section line A-A shown in FIG. 2A) of an illustrative heat sink 218 coupled directly to a PCB 220 (shown as a cutout of a larger PCB for illustration purposes). A surface-mounted component 204 is coupled to a mounting side 206 of the heat sink 218. The heat sink 218 may be secured in the PCB 220 such that the mounting side 206 is approximately coplanar with a first side 208 of the PCB 220. In some embodiments, the heat sink 218 may be inserted into an aperture 210 during manufacture of the PCB 220, such as when layers of the PCB are added to form the PCB.

The PCB 220 may include a first restraining feature 212 and a second restraining feature 222, such as a lip, shelf, or other type of feature that constrains movement of the heat sink 218. As shown, the first restraining feature 212 and the second restraining feature 222 constrain movement of the heat sink in the PCB 220. Contact by the heat sink 218 with the first restraining feature 212 and the second restraining feature 222, via a feature 224 of the heat sink, may coincide with alignment of the mounting side 206 and first side 208 of the PCB.

As shown, the heat sink 218 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

Figure 2D:
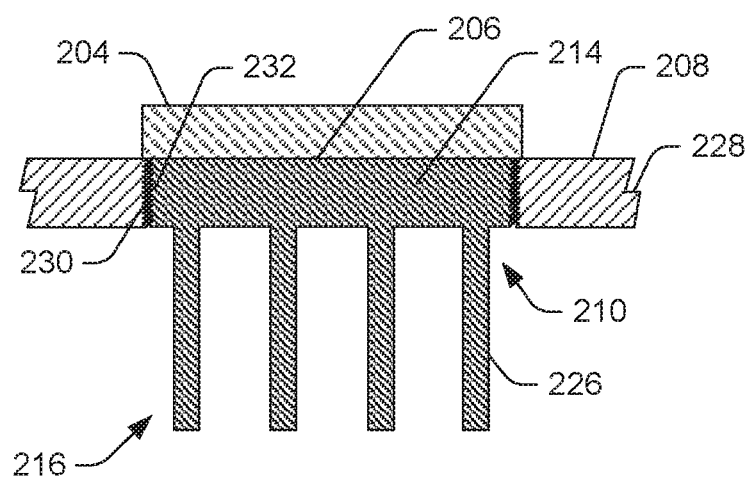

FIG. 2D shows a cross-sectional side elevation view (along section line A-A shown in FIG. 2A) of an illustrative heat sink 226 coupled directly to a PCB 228 (shown as a cutout of a larger PCB for illustration purposes). A surface-mounted component 204 is coupled to a mounting side 206 of the heat sink 226. The heat sink 226 may be secured in the PCB 228 such that the mounting side 206 is approximately coplanar with a first side 208 of the PCB 228. In some embodiments, the heat sink 226 may be inserted into an aperture 210 of the PCB 228.

The PCB 228 may include a PCB threaded restraining feature 230 and the heat sink 226 may include a corresponding heat sink threaded restraining feature 232 to securely engage the PCB threaded restraining feature 230. As shown, the PCB threaded restraining feature 230 and the heat sink threaded restraining feature 232, when engaged, constrain movement of the heat sink in the PCB 228. In some embodiments, the heat sink threaded restraining feature 232 may be a self-tapping thread and may not require use of the PCB threaded restraining feature 230, but may rather create the PCB threaded restraining feature 230 as the heat sink is inserted into the PCB 228.

As shown, the heat sink 226 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

Figure 2E:
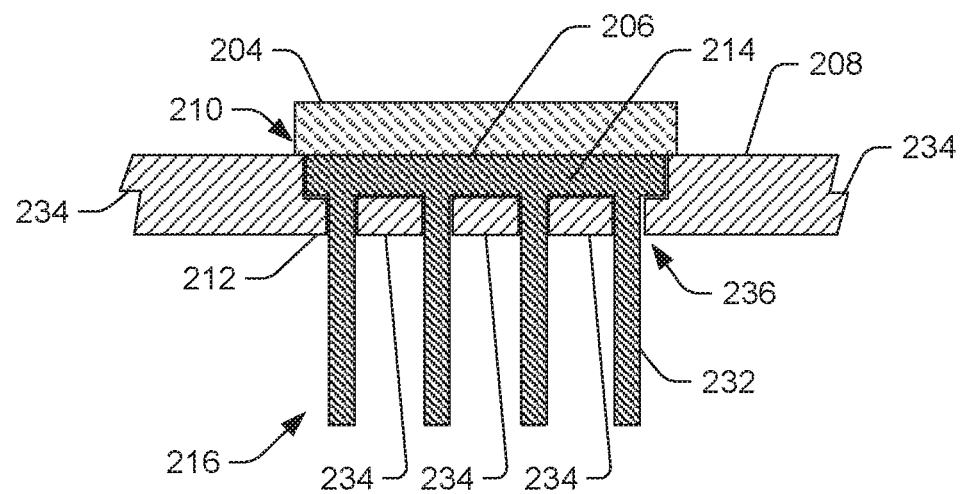

FIG. 2E shows a cross-sectional side elevation view (along section line A-A shown in FIG. 2A) of an illustrative heat sink 232 coupled directly to a PCB 234 (shown as a cutout of a larger PCB for illustration purposes). A surface-mounted component 204 is coupled to a mounting side 206 of the heat sink 232. The heat sink 232 may be press fit or otherwise secured in the PCB 234 such that the mounting side 206 is approximately coplanar with a first side 208 of the PCB 234. In some embodiments, the heat sink 232 may be inserted into an aperture 210 by way of the first side 208 of the PCB 234.

The PCB 234 may include a restraining feature 212, such as a lip, shelf, or other type of feature that constrains movement of the heat sink 232 in at least one direction. As shown, the restraining feature 212 enables insertion of the heat sink into the aperture 210, but prevents the heat sink from moving past the restraining feature 212. Contact by the heat sink 232 with the restraining feature 212 may coincide with alignment of the mounting side 206 and first side 208 of the PCB.

As shown, the heat sink 232 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

The PCB 234 may include a plurality of apertures 236 that correspond to locations of the fins 216 such that the fins 216 project through the apertures 236. By incorporating the apertures 236, the PCB 234 may have increased rigidity and the body portion 214 of the heat sink 232 may be reduced in thickness, which may reduce weight of the heat sink 232.

Figure 2F:
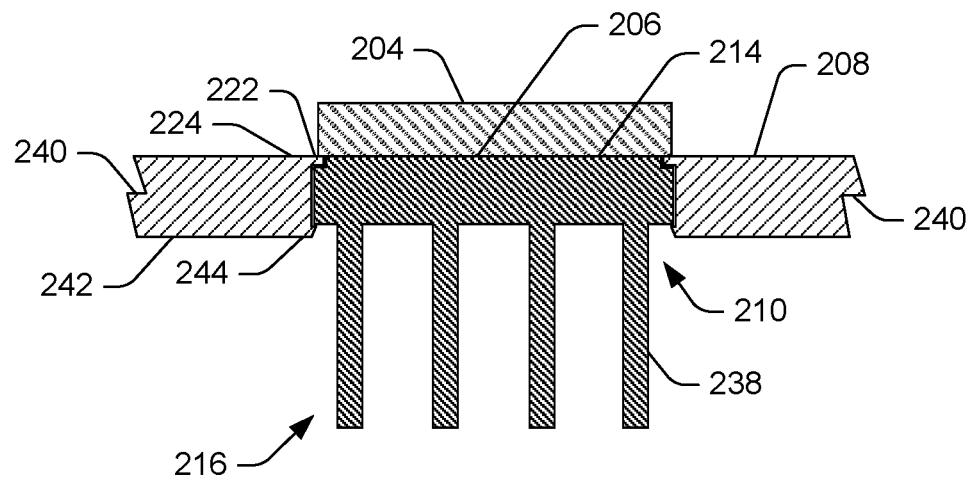

FIG. 2F shows a cross-sectional side elevation view (along section line A-A shown in FIG. 2A) of an illustrative heat sink 238 coupled directly to a PCB 240 (shown as a cutout of a larger PCB for illustration purposes). A surface-mounted component 204 is coupled to a mounting side 206 of the heat sink 238. The heat sink 238 may be secured in the PCB 240 such that the mounting side 206 is approximately coplanar with a first side 208 of the PCB 240. In some embodiments, the heat sink 238 may be inserted into an aperture 210 of the PCB 240 via a second side 242 of the PCB 240.

The PCB 240 may include a first restraining feature 244 and a second restraining feature 222, such as a lip, shelf, or other type of feature that constrains movement of the heat sink 238. As shown, the first restraining feature 244 and the second restraining feature 222 constrain movement of the heat sink in the PCB 240. Contact by the heat sink 238 with the first restraining feature 244 and the second restraining feature 222, via a feature 224 of the heat sink, may coincide with alignment of the mounting side 206 and first side 208 of the PCB. The first restraining feature 244 may include an angled edge, which may enable one-directional movement of the heat sink 238 into the aperture 210 until the heat sink 238 snaps into place in a cavity formed by the PCB 240 via the first restraining feature 244 and the second restraining feature 222. The first restraining feature 244 may not be continuous around a perimeter of the aperture 210. The first restraining feature 244 may impart a force on the PCB to slightly flex the PCB to enable insertion of the heat sink into the aperture 210.

As shown, the heat sink 238 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

Figure 2G:
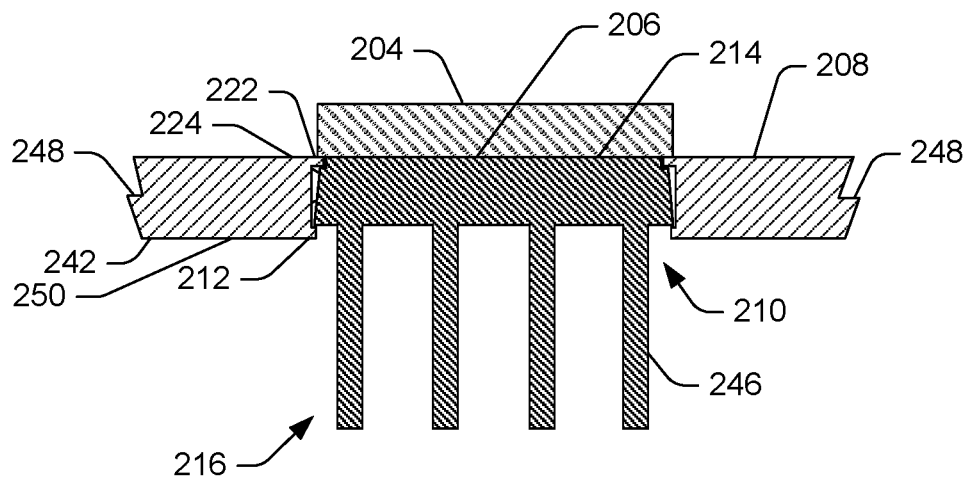

FIG. 2G shows a cross-sectional side elevation view (along section line A-A shown in FIG. 2A) of an illustrative heat sink 246 coupled directly to a PCB 248 (shown as a cutout of a larger PCB for illustration purposes). A surface-mounted component 204 is coupled to a mounting side 206 of the heat sink 246. The heat sink 246 may be secured in the PCB 248 such that the mounting side 206 is approximately coplanar with a first side 208 of the PCB 248. In some embodiments, the heat sink 246 may be inserted into an aperture 210 of the PCB 248, via a second side 242 of the PCB 248.

The PCB 248 may include a first restraining feature 212 and a second restraining feature 222, such as a lip, shelf, or other type of feature that constrains movement of the heat sink 246. As shown, the first restraining feature 212 and the second restraining feature 222 constrain movement of the heat sink in the PCB 248. Contact by the heat sink 246 with the first restraining feature 212 and the second restraining feature 222, via a feature 224 of the heat sink, may coincide with alignment of the mounting side 206 and first side 208 of the PCB. An angled sidewall 250 of the heat sink 246 may include an angled edge, which may enable one-directional movement of the heat sink 246 into the aperture 210 until the heat sink 246 snaps into place in a cavity formed by the PCB 248 via the first restraining feature 212 and the second restraining feature 222. The angled sidewall 250 of the heat sink 246 may not be continuous around a perimeter of the heat sink. The angled sidewall 250 of the heat sink 246 may impart a force on the PCB to slightly flex the PCB to enable insertion of the heat sink into the aperture 210.

As shown, the heat sink 246 includes a body portion 214 and a plurality of fins 216 that extend outward from the body portion 214 and away from the mounting side 206. The fins 216 may be integrally formed with the body portion 214 from a same material having low thermal resistance, such as copper. The fins 216 may be formed in any manner as conventional fins, such as cylinders or other extruded forms that extend outward from the body portion 214, as planar fins that extend across a side of the body portion 214 that is opposite the mounting side 206, or as other shapes and/or forms. Additional formations of the body portion 214 and/or of the fins 216 may also be used, such as those shown and described with reference to at least FIGS. 3A and 3B.

Figure 3A:
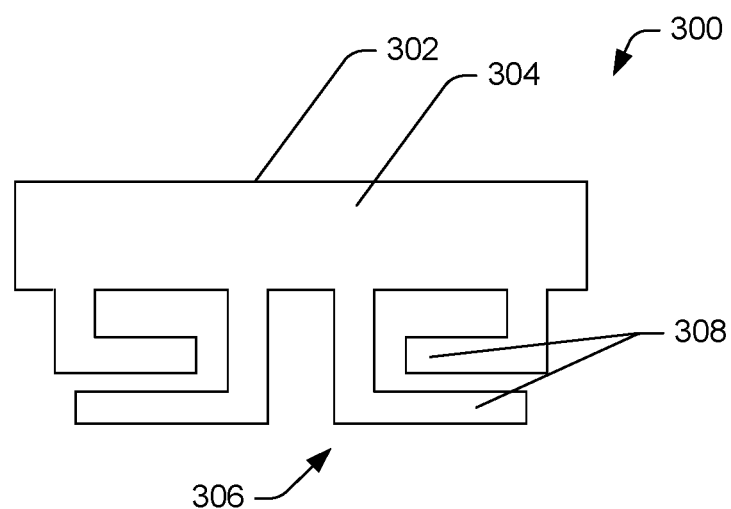
FIGS. 3A and 3B are side elevation views of illustrative heat sinks configured to draw heat through a PCB.

FIG. 3A is a side elevation view of an illustrative heat sink 300 configured to draw heat through a PCB. The heat sink 300 may include a mounting side 302 that may physically interface with a surface-mounted component to draw heat from the surface-mounted component and through a PCB as shown and described with reference to FIGS. 2A-2F. As shown, the heat sink 300 includes a body portion 304 and a plurality of fins 306 that extend outward from the body portion 304. The fins 306 may include an angled portion 308 that reduces a depth of the heat sink with minimal or no reduction in heat transfer effectiveness of the heat sink 300 as compared to the heat sink 200 having linear fins. The fins 306 may be curved or otherwise include the angled portion 308 to reduce the depth of the heat sink. The fins 306 may be incorporated on any heat sink discussed above, and particularly with any heat sink shown in FIGS. 2A-2F.

Figure 3B:
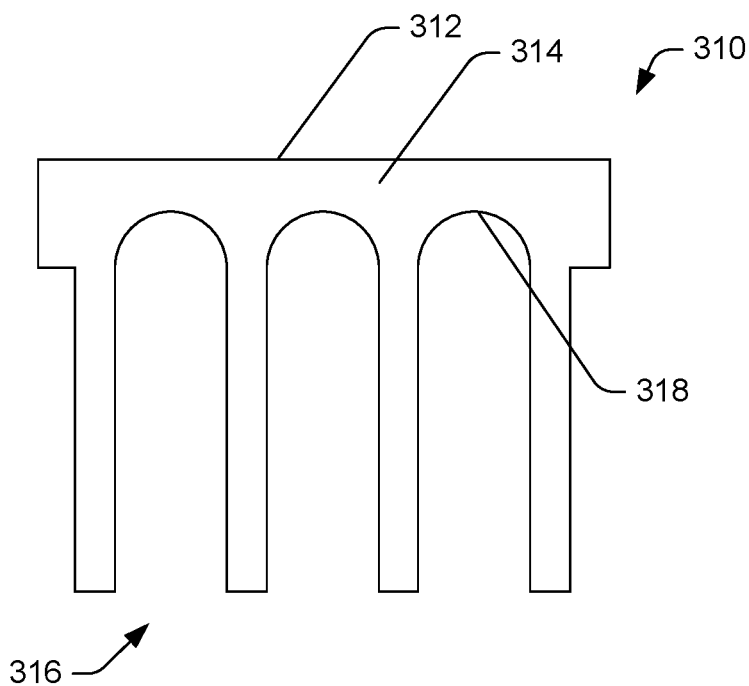

FIG. 3B is a side elevation view of an illustrative heat sink 310 configured to draw heat through a PCB. The heat sink 310 may include a mounting side 312 that may physically interface with a surface-mounted component to draw heat from the surface-mounted component and through a PCB as shown and described with reference to FIGS. 2A-2F. As shown, the heat sink 310 includes a body portion 314 and a plurality of fins 316 that extend outward from the body portion 314. The body portion 314 may include one or more cavities 318 that reduces material used to create the heat sink with minimal or no reduction in heat transfer effectiveness of the heat sink 310 as compared to the heat sink 200 that does not have the cavities 318. The cavities 318 may be incorporated on any heat sink discussed above, and particularly with any heat sink shown in FIGS. 2A-2F.

Figure 4A:
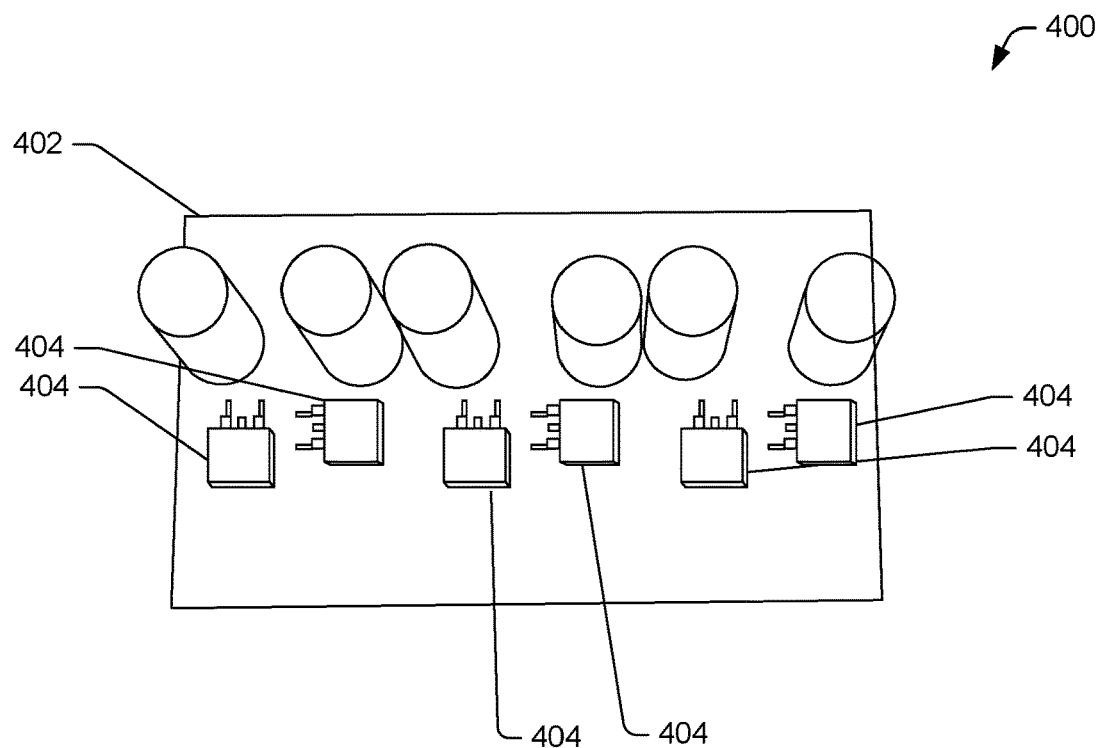
FIGS. 4A-4B are perspective views of an electronic device including a PCB having multiple heat sinks.
Figure 4B:
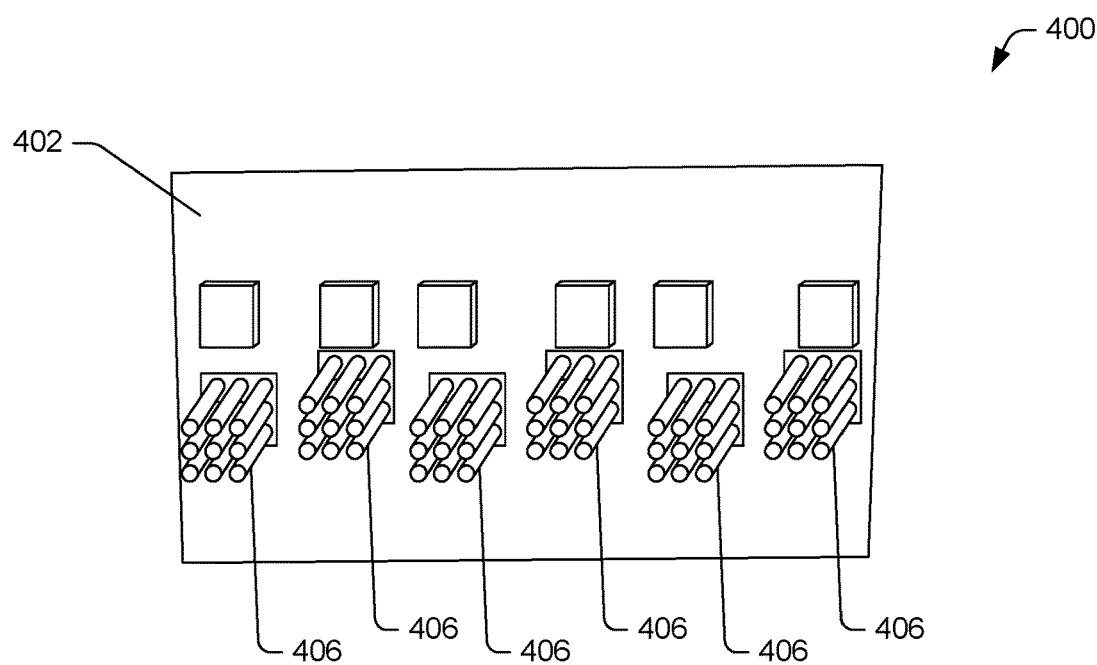

FIG. 4A is a top perspective view of an electronic device 400 that includes a PCB 402 having multiple surface-mounted components 404. The surface-mounted components 404 may be mounted over and physically interface with heat sinks 406 shown in FIG. 4B in accordance with various embodiments. The PCB 402 may include multiple apertures that each correspond to individual heat sinks to enable the heat sinks to draw heat from the surface-mounted components through the PCB 402 to a side of the PCB opposite the surface-mounted component.

FIGS. 5A-5F are side elevation views of illustrative PCBs that include illustrative connectors configured to couple components such as heat sinks to the PCBs.

Figure 5A:
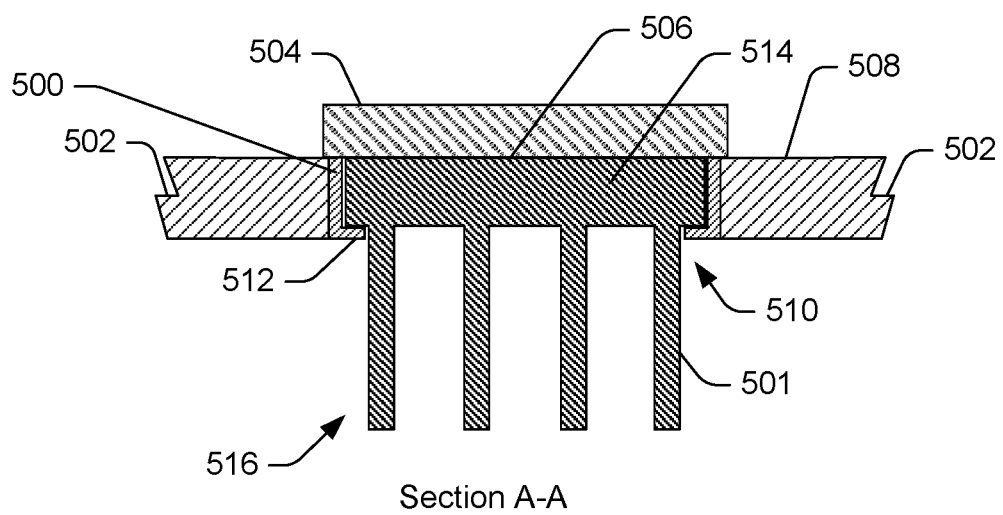
FIGS. 5A-5F are side elevation views of illustrative PCBs that include illustrative connectors configured to couple components such as heat sinks to the PCBs.

FIG. 5A shows a cross-sectional side elevation view (along section line A-A shown in FIG. 2A) of an illustrative connector 500 coupled directly to a PCB 502 (shown as a cutout of a larger PCB for illustration purposes). The connector 500 may couple to a heat sink 501 or another component. However, the examples that follow pertain to coupling, by the connector 500, to a heat sink.

A surface-mounted component 504 may be coupled to a mounting side 506 of the heat sink 500. The connector 500 may be press fit or otherwise secured in the PCB 502 such that the mounting side 506 is approximately coplanar with a first side 508 of the PCB 502 when the heat sink 501 is coupled to the connector 500. In some embodiments, the connector 500 may be inserted into an aperture 510 by way of the first side 508 of the PCB 502. In accordance with various embodiments, the connector 500 (or any other conductor discussed herein) may be formed of a thermally conductive material, such as copper to assist in drawing heat from the surface mounted component.

The connector 500 may include a restraining feature 512, such as a lip, shelf, or other type of feature that constrains movement of the heat sink 501 in at least one direction. As shown, the restraining feature 512 enables insertion of the heat sink into the aperture 510, but prevents the heat sink from moving past the restraining feature 512. Contact by the heat sink 501 with the restraining feature 512 may coincide with alignment of the mounting side 506 and first side 508 of the PCB.

As shown, the heat sink 500 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

Figure 5B:
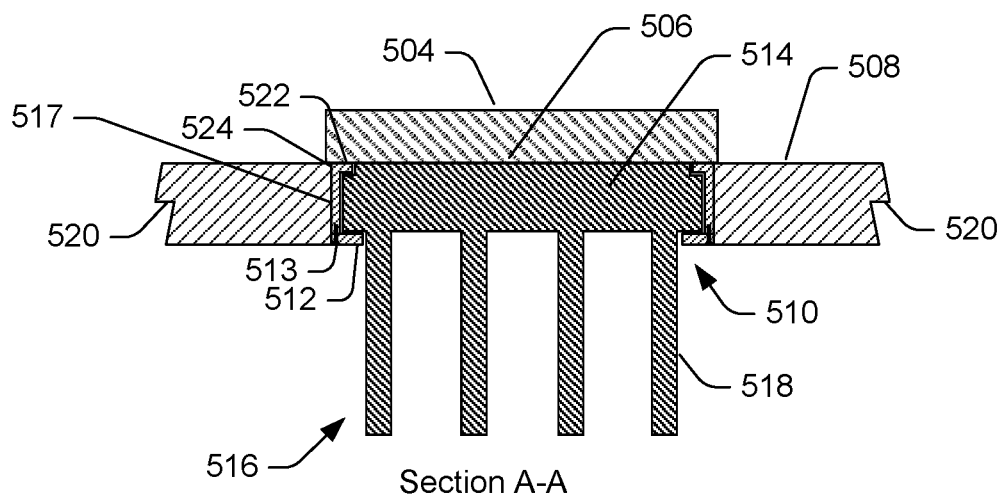

FIG. 5B shows a cross-sectional side elevation view (along section line A-A shown in FIG. 2A) of an illustrative connector 517 coupled directly to a PCB 520 (shown as a cutout of a larger PCB for illustration purposes). The connector 517 may couple to a heat sink 518 or another component. However, the examples that follow pertain to coupling, by the connector 517, to a heat sink.

A surface-mounted component 504 may be coupled to a mounting side 506 of the heat sink 518. The connector 517 may be secured in the PCB 520 such that the mounting side 506 is approximately coplanar with a first side 508 of the PCB 520 when the heat sink 501 is coupled to the connector 500. In some embodiments, the heat sink 518 may be inserted into an aperture 510.

The connector 517 may include a first restraining feature 512 and a second restraining feature 522, such as a lip, shelf, or other type of feature that constrains movement of the heat sink 518. The first restraining feature 512 may be secured to the connector 517 via a coupler 513, such as a set screw or other coupler. As shown, the first restraining feature 512 and the second restraining feature 522 constrain movement of the heat sink in the connector 517 and relative to the PCB 520. Contact by the heat sink 518 with the first restraining feature 512 and the second restraining feature 522, via a feature 524 of the heat sink, may coincide with alignment of the mounting side 506 and first side 508 of the PCB.

As shown, the heat sink 518 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

Figure 5C:
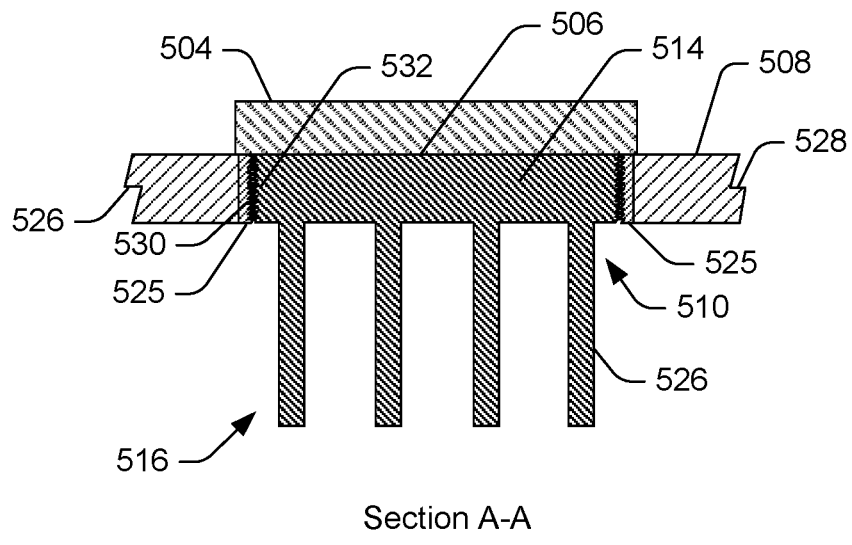

FIG. 5C shows a cross-sectional side elevation view (along section line A-A shown in FIG. 2A) of an illustrative connector 525 coupled directly to a PCB 528 (shown as a cutout of a larger PCB for illustration purposes). The connector 525 may couple to a heat sink 526 or another component. However, the examples that follow pertain to coupling, by the connector 500, to a heat sink.

A surface-mounted component 504 is coupled to a mounting side 506 of the heat sink 526. The connector 525 may be secured in the PCB 528 such that the mounting side 506 is approximately coplanar with a first side 508 of the PCB 528 when the heat sink 526 is coupled to the connector 525. In some embodiments, the connector 525 may be inserted into an aperture 510 of the PCB 528.

The connector 525 may include a connector threaded restraining feature 530 and the heat sink 526 may include a corresponding heat sink threaded restraining feature 532 to securely engage the connector threaded restraining feature 530. As shown, the connector threaded restraining feature 530 and the heat sink threaded restraining feature 532, when engaged, constrain movement of the heat sink in the connector 525.

As shown, the heat sink 526 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

Figure 5D:
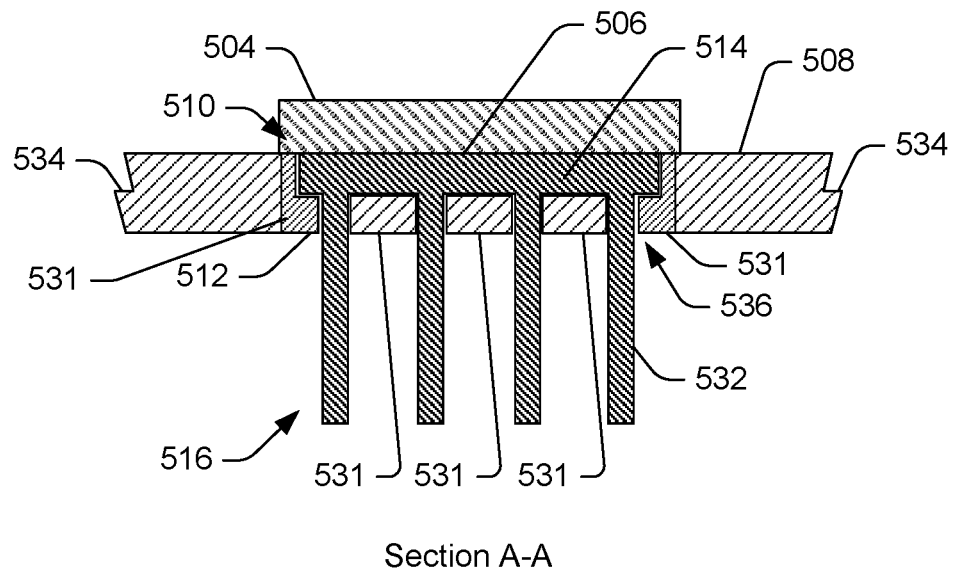

FIG. 5D shows a cross-sectional side elevation view (along section line A-A shown in FIG. 2A) of an illustrative connector 531 coupled directly to a PCB 534 (shown as a cutout of a larger PCB for illustration purposes). The connector 531 may couple to a heat sink 532 or another component. However, the examples that follow pertain to coupling, by the connector 531, to a heat sink.

A surface-mounted component 504 is coupled to a mounting side 506 of the heat sink 532. The heat sink 532 may be press fit or otherwise secured in the PCB 534 such that the mounting side 506 is approximately coplanar with a first side 508 of the PCB 534 when the heat sink 532 is coupled to the connector 531. In some embodiments, the connector 531 may be inserted into an aperture 510 by way of the first side 508 of the PCB 534.

The connector 531 may include a restraining feature 512, such as a lip, shelf, or other type of feature that constrains movement of the heat sink 532 in at least one direction. As shown, the restraining feature 512 enables insertion of the heat sink into the aperture 510, but prevents the heat sink from moving past the restraining feature 512. Contact by the heat sink 532 with the restraining feature 512 may coincide with alignment of the mounting side 506 and first side 508 of the PCB.

As shown, the heat sink 532 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

The connector 531 may include a plurality of apertures 536 that correspond to locations of the fins 516 such that the fins 516 project through the apertures 536. By incorporating the apertures 536, the connector 534 may have increased rigidity and the body portion 514 of the heat sink 532 may be reduced in thickness, which may reduce weight of the heat sink 532.

Figure 5E:
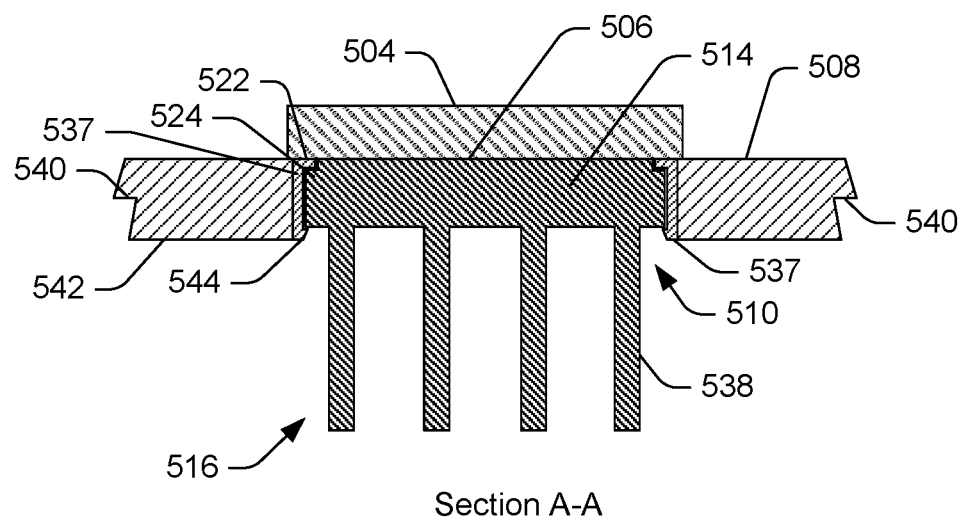

FIG. 5E shows a cross-sectional side elevation view (along section line A-A shown in FIG. 2A) of an illustrative connector 537 coupled directly to a PCB 540 (shown as a cutout of a larger PCB for illustration purposes). The connector 500 may couple to a heat sink 501 or another component. However, the examples that follow pertain to coupling, by the connector 500, to a heat sink.

A surface-mounted component 504 is coupled to a mounting side 506 of the heat sink 538. The heat sink 538 may be secured in the PCB 540 such that the mounting side 506 is approximately coplanar with a first side 508 of the PCB 540 when the heat sink 538 is coupled to the connector 537. In some embodiments, the heat sink 538 may be inserted into an aperture 510 of the connector 537 via a second side 542 of the PCB 540.

The connector 537 may include a first restraining feature 544 and a second restraining feature 522, such as a lip, shelf, or other type of feature that constrains movement of the heat sink 538. As shown, the first restraining feature 544 and the second restraining feature 522 constrain movement of the heat sink in the PCB 540. Contact by the heat sink 538 with the first restraining feature 544 and the second restraining feature 522, via a feature 524 of the heat sink, may coincide with alignment of the mounting side 506 and first side 508 of the PCB. The first restraining feature 544 may include an angled edge, which may enable one-directional movement of the heat sink 538 into the aperture 510 until the heat sink 538 snaps into place in a cavity formed by the connector 537 via the first restraining feature 544 and the second restraining feature 522. The first restraining feature 544 may not be continuous around a perimeter of the aperture 510. The first restraining feature 544 may impart a force on the connector 537 to slightly flex the connector 537 to enable insertion of the heat sink into the aperture 510.

As shown, the heat sink 538 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

Figure 5F:
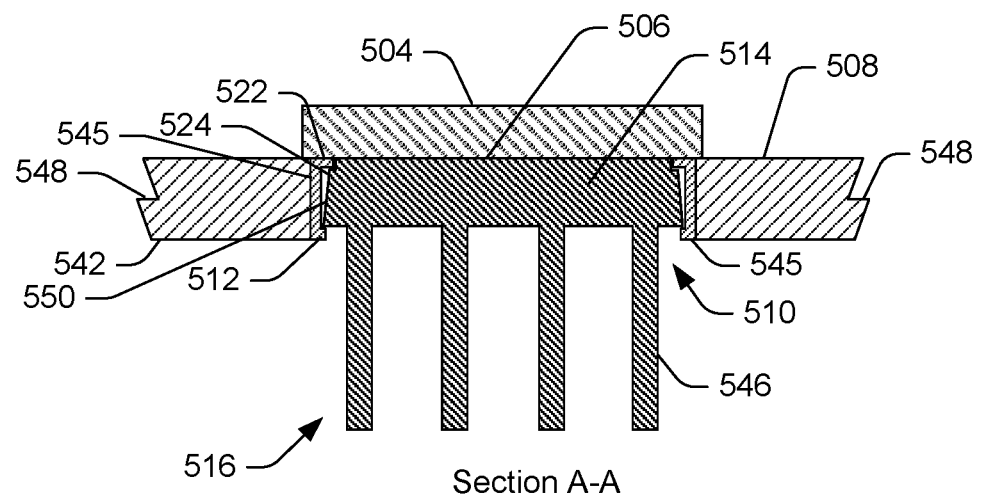

FIG. 5F shows a cross-sectional side elevation view (along section line A-A shown in FIG. 2A) of an illustrative connector 545 coupled directly to a PCB 548 (shown as a cutout of a larger PCB for illustration purposes). The connector 500 may couple to a heat sink 501 or another component. However, the examples that follow pertain to coupling, by the connector 500, to a heat sink.

A surface-mounted component 504 is coupled to a mounting side 506 of the heat sink 546. The heat sink 546 may be secured in the PCB 548 such that the mounting side 506 is approximately coplanar with a first side 508 of the PCB 548 when the heat sink 546 is coupled to the connector 545. In some embodiments, the heat sink 546 may be inserted into an aperture 510 of the connector 547, via a second side 542 of the PCB 548.

The connector 545 may include a first restraining feature 512 and a second restraining feature 522, such as a lip, shelf, or other type of feature that constrains movement of the heat sink 546. As shown, the first restraining feature 512 and the second restraining feature 522 constrain movement of the heat sink in the connector 545. Contact by the heat sink 546 with the first restraining feature 512 and the second restraining feature 522, via a feature 524 of the heat sink, may coincide with alignment of the mounting side 506 and first side 508 of the PCB. An angled sidewall 550 of the heat sink 546 may include an angled edge, which may enable one-directional movement of the heat sink 546 into the aperture 510 until the heat sink 546 snaps into place in a cavity formed by the connector 545 via the first restraining feature 512 and the second restraining feature 522. The angled sidewall 550 of the heat sink 546 may not be continuous around a perimeter of the heat sink. The angled sidewall 550 of the heat sink 546 may impart a force on the connector 545 to slightly flex the connector 545 to enable insertion of the heat sink into the aperture 510.

As shown, the heat sink 546 includes a body portion 514 and a plurality of fins 516 that extend outward from the body portion 514 and away from the mounting side 506. The fins 516 may be integrally formed with the body portion 514 from a same material having low thermal resistance, such as copper. The fins 516 may be formed in any manner as conventional fins, such as cylinders or other extruded forms that extend outward from the body portion 514, as planar fins that extend across a side of the body portion 514 that is opposite the mounting side 506, or as other shapes and/or forms. Additional formations of the body portion 514 and/or of the fins 516 may also be used, such as those shown and described with reference to at least FIGS. 3A and 3B.

FIG. 6 is a flow diagram of an illustrative process 300 to authorize a payment with a mobile device application. The process 300 is illustrated as a collection of blocks in a logical flow graph, which represent a sequence of operations The order in which the operations are described is not intended to be construed as a limitation, and any number of the described blocks can be combined in any order and/or in parallel to implement the process.

FIG. 6 is a flow diagram of an illustrative process 600 to manufacture a PCB that includes a connector and/or a heat sink configured to draw heat through a PCB.

At 602, layers of the PCB may be created that include one or more apertures. For example, the apertures may be created in the layers by a die cutting process or other material removal process, such as milling material from the layer. The apertures may be created during an additive manufacturing process, such as by omitting to place material in locations, which form the apertures in each layer (e.g., by omission of material). The layers may include conductive layers, such as metallic layers formed of at least partially of copper or other conductive materials. The apertures in each layer may be the same size as a different layer or may be a different size than a different layer. Different sized apertures may be used to form the restraint features discussed above with reference to FIGS. 2A-2F and FIGS. 5A-5F.

At 604, the PCB may be formed by combining the layers. The apertures formed in the layers may be aligned to create one or more PCB apertures. The PCB apertures may extend from a first side of the PCB toward a second side of the PCB opposite the first side. In some embodiments, the apertures may extend completely through the PCB and span between the first side and the second side of the PCB.

At 606, a connector may be coupled to an aperture of the PCB formed via the operation 604. The connector may be coupled via any of the coupling features described above with reference to FIGS. 5A-5F. This operation may be omitted in some embodiments.

At 608, a heat sink may be coupled to the connector (or directly to an aperture of the PCB when no connector is used). The heat sink may include a mounting side that mounts approximately along a same plane as a first side of the PCB. The heat sink may include a fin side having a plurality of fins that extend outward and away from the mounting side of the heat sink and outward and away from a second side of the PCB that is opposite the first side of the PCB.

At 610, a surface-mounted component may be coupled to the mounting side of the heat sink. The surface-mounted component may physically interface with the heat sink. In some embodiments, a thermal additive, such as thermal grease, thermal tape, or another thermal additive may be used between the heat sink and the surface-mounted component to reduce thermal resistance during heat transfer between the surface-mounted component and the heat sink. The heat sink may operate to draw heat from the surface-mounted component through the PCB toward the second side of the PCB.

In accordance with various embodiments, the manufacturing process may be used to create an electronic device and/or a PCB that includes a heat sink. The process may include creating a layer aperture in each layer used to form the PCB. A first layer aperture may include a size smaller than a second layer aperture. The process may include forming a PCB by aligning each layer aperture in each layer to create a PCB aperture that extends from a first side of the PCB toward a second side of the PCB. The process may include coupling the heat sink to the PCB by inserting the heat sink at least partially through the PCB aperture. The heat sink may include a mounting side that is opposite a fin side of the heat sink. The heat sink may be constrained in at least one direction by a surface of a first layer that includes the first layer aperture. The process may include coupling a surface-mounted component to the first side of the PCB over the heat sink. The surface-mounted component may physically interface with the mounting side of the heat sink. The fin side of the heat sink may include a plurality of fins to dissipated heat generated from the surface-mounted component and drawn through the PCB toward a side opposite the surface-mounted component.

In some embodiments, the process may further include coupling a connector to the PCB prior to coupling the heat sink to the PCB, and wherein the heat sink is coupled to the connector that interfaces with the PCB. The first layer aperture is a rectangular aperture may be formed by at least one of a die cutting process or by an omission during an additive manufacturing process that uses three-dimensional printing. Coupling the heat sink to the PCB may include inserting the heat sink through the first side of the PCB toward the second side of the PCB until the heat sink engages the first layer of the PCB. The process may further include applying thermal grease, thermal tape, or another thermal additive to the mounting side of the heat sink prior to coupling of the surface-mounted component to the PCB.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic device, comprising:
    a heat sink having a mounting side that is substantially planar and a fin side opposite the mounting side that includes a plurality of fins;
    a printed circuit board (PCB) including:
        a plurality of layers, the plurality of layers including individual layers that include at least one layer aperture of a plurality of layer apertures, the plurality of layer apertures forming a PCB aperture that extends from a first side of the PCB towards a second side of the PCB, the PCB aperture configured to receive the heat sink at least partially through the PCB and couple with the heat sink via a first thread portion of the heat sink and a second thread portion of the PCB,
        a first layer of the plurality of layers that includes a first layer aperture of the plurality of layer apertures, and
        a second layer of the plurality of layers that includes a second layer aperture of the plurality of layer apertures, wherein a first cross-sectional area of the first layer aperture is less than a second cross-sectional area of the second layer aperture, the first layer at least partially constraining movement of the heat sink relative to the PCB after installation of the heat sink in the PCB aperture, and wherein a third cross-sectional area of the heat sink is greater than the first cross-sectional area and is equal to or less than the second cross-sectional area; and
    a surface-mounted component coupled to the first side of the PCB, the surface-mounted component to physically interface with the mounting side of the heat sink.

2. The electronic device as recited in claim 1, further comprising a third layer of the plurality of layers that includes a third layer aperture of the plurality of layer apertures, wherein the third cross-sectional area of the heat sink is less than a fourth cross-sectional area of the third layer aperture.

3. The electronic device as recited in claim 1, wherein at least some of the plurality of fins include a bend to reduce a thickness of the PCB that includes the heat sink.

4. The electronic device as recited in claim 1, wherein at least one layer aperture of the plurality of layer apertures includes a rectangular-shaped aperture.

5. The electronic device as recited in claim 1, the surface-mounted component including a switching semiconductor.

6. The electronic device as recited in claim 1, the PCB including PCB features that restrict movement of the heat sink after installation of the heat sink.

7. The electronic device as recited in claim 6, the PCB features including at least one of an angled clip or an angled lip that allows movement of the heat sink in a first direction and restricts movement of the heat sink in a second direction that is opposite the first direction.

8. The electronic device as recited in claim 1, further comprising a connector coupled to the PCB aperture, the connector including connector features to couple to the heat sink.

9. The electronic device as recited in claim 1, wherein a thickness of a first portion of the heat sink that includes the mounting side is less than a thickness of the PCB.

10. The electronic device as recited in claim 1, the second thread portion of the PCB configured to couple to a third thread portion of a connector to interface with the heat sink.

11. An apparatus, comprising:
    a heat sink having a mounting side that is substantially planar and a fin side opposite the mounting side that includes a plurality of fins;
    a printed circuit board (PCB) coupled, via a first thread portion of the heat sink and a second thread portion of the PCB, to the heat sink and including a plurality of layers, the plurality of layers including individual layers that include at least one layer aperture of a plurality of layer apertures, the plurality of layer apertures forming a PCB aperture that extends from a first side of the PCB towards a second side of the PCB, wherein a first cross-sectional area of the heat sink is equal to or less than a second cross-sectional area of a first layer aperture of the plurality of layer apertures and is greater than a third cross-sectional area of a second layer aperture of the plurality of layer apertures; and
    a connector device configured for insertion into the PCB aperture, the connector device configured to physically interface with (i) a first portion of the PCB and a second portion of the PCB, and (ii) the heat sink wherein the first portion and the second portion are separated by the heat sink.

12. The apparatus as recited in claim 11, wherein at least some of the plurality of fins include a bend to reduce a thickness of the PCB that includes the heat sink.

13. The apparatus as recited in claim 11, further comprising a surface-mounted component coupled to the first side of the PCB, the surface-mounted component to physically interface with the mounting side of the heat sink.

14. The apparatus as recited in claim 11, the connector device including a third thread portion that interfaces with the plurality of layers of the PCB to couple the connector device to the PCB.

15. The apparatus as recited in claim 11, the first cross-sectional area of the heat sink including a rectangular cross-sectional shape that corresponds to a rectangular-shaped aperture formed in the connector device.

16. An electronic device, comprising:
a printed circuit board (PCB) including a plurality of layers that form the PCB and a plurality of layer apertures, wherein a first layer of the plurality of layers includes a first layer aperture of the plurality of layer apertures and a second layer of the plurality of layers includes a second layer aperture of the plurality of layer apertures, wherein a first cross-sectional area of the first layer aperture is less than a second cross-sectional area of the second layer aperture, and the PCB including a PCB aperture formed by aligning at least the first layer aperture and the second layer aperture, the PCB aperture extending from a first side of the PCB towards a second side of the PCB;
a heat sink coupled to the PCB via a first thread portion of the heat sink and a second thread portion of the PCB and through insertion of the heat sink at least partially through the PCB aperture, the heat sink including a mounting side that is opposite a fin side and is constrained in at least one direction by a surface of the first layer that includes the first layer aperture, and wherein a third cross-sectional area of the heat sink is greater than the first cross-sectional area of the first layer aperture and is equal to or less than the second cross-sectional area of the second layer aperture; and
a surface-mounted component coupled to the first side of the PCB, the surface-mounted component to physically interface with the mounting side of the heat sink, the fin side including a plurality of fins to dissipate heat from the surface-mounted component drawn by the heat sink through the PCB and towards the second side of the PCB opposite the surface-mounted component.

17. The electronic device as recited in claim 16, further comprising a connector coupled to the PCB, the heat sink coupled to the connector.

18. The electronic device as recited in claim 16, the first layer aperture including a rectangular aperture.

19. The electronic device as recited in claim 16, wherein the heat sink coupled to the PCB is inserted through the first side of the PCB toward the second side of the PCB and is engaged to the first layer of the PCB.

20. The electronic device as recited in claim 16, further comprising thermal grease applied to the mounting side of the heat sink.

* * * * *